United States Patent
Bekku et al.

(10) Patent No.: US 7,907,767 B2
(45) Date of Patent: Mar. 15, 2011

(54) MAGNETIC RESONANCE IMAGING APPARATUS AND METHOD FOR SETTING SHIM VALUES

(75) Inventors: Mitsuhiro Bekku, Tokyo (JP); Naotaka Adachi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 953 days.

(21) Appl. No.: 11/757,786

(22) Filed: Jun. 4, 2007

(65) Prior Publication Data

US 2007/0280524 A1    Dec. 6, 2007

(30) Foreign Application Priority Data

Jun. 5, 2006 (JP) ................. 2006-156426

(51) Int. Cl.
*G06K 9/00* (2006.01)
(52) U.S. Cl. ......................... 382/131
(58) Field of Classification Search .......... 382/128, 382/131, 154; 600/410; 324/307
See application file for complete search history.

(56) References Cited

U.S. PATENT DOCUMENTS

| | | | |
|---|---|---|---|
| 5,773,976 A | 6/1998 | Sakakura et al. | 324/318 |
| 5,876,337 A | 3/1999 | Tsuda | 600/410 |
| 6,294,972 B1 | 9/2001 | Jesmanowicz et al. | 335/301 |
| 6,472,872 B1 | 10/2002 | Jack, Jr. et al. | 324/309 |
| 6,529,002 B1 | 3/2003 | Kim et al. | 324/312 |
| 6,634,088 B1 | 10/2003 | Morrone | 29/607 |
| 6,984,982 B2 | 1/2006 | Huang et al. | 324/318 |
| 7,215,123 B2 | 5/2007 | Axel | 324/318 |

*Primary Examiner* — Andrew W Johns
(74) *Attorney, Agent, or Firm* — Armstrong Teasdale LLP (57) ABSTRACT

The invention is intended to obtain optimal shim values even if slice planes are slanted with respect to the system-inherent coordinate system. The section for setting a plane for calculating shim values sets planes perpendicular to and a plane parallel with a slice plane in a system of coordinates x', y', and z' perpendicular to the slice plane. The section for calculating shim values obtains shim values with regard to this slice plane in this coordinate system, based on data acquired by the data acquiring section. The coordinates converting section converts the thus obtained shim values to shim values in the system-inherent x-y-z coordinate system of the MRI apparatus.

20 Claims, 5 Drawing Sheets

SYSTEM OF X'-Y'-Z'
COORDINATES PERPENDICULAR
TO SLICE PLANE

SYSTEM-INHERENT X-Y-Z
COORDINATE SYSTEM

FIG. 7

MAGNETIC RESONANCE IMAGING APPARATUS AND METHOD FOR SETTING SHIM VALUES

CROSS REFERENCE TO RELATED APPLICATIONS

This application claims the benefit of Japanese Application No. 2006-156426 filed Jun. 5, 2006.

BACKGROUND OF THE INVENTION

The present invention relates to a magnetic resonance imaging system that calculates shim values and corrects inhomogeneity of static magnetic field based on these values and a method for setting shim values.

An MRI apparatus applies a magnetic field to a subject and produces a tomographic image of the subject, based on detected echo signals from the subject. If the static magnetic field is not homogeneous, phase rotation occurs due to this and causes ghosting and positional distortion (artifacts); it is thus required to keep the static magnetic field homogeneous in order to accurately reflect the internal structure of a probed portion of the subject.

For the MRI, shimming (correcting inhomogeneity of static magnetic field) is important to reduce such artifacts.

When shimming is carried out, conventionally, shim values which are parameters for shimming are calculated based on data acquired by scanning the planes (e.g., x, y, and z planes) based on a system-inherent coordinate system (e.g., a system of x, y, and z coordinates). However, this method has a drawback in which, when slice planes (including tomographic imaging data) are slanted with respect to the system-inherent coordinate system, acquired shim values are non-optimal and it is unable to well correct inhomogeneity.

SUMMARY OF THE INVENTION

It is desirable that the problem described previously is solved.

A first aspect of the invention resides in a magnetic resonance imaging apparatus, which carries out shimming, comprising a section for setting a slice plane, which sets at least one slice plane for obtaining desired tomographic image data; and a section for setting shim values, which calculates and sets shim values for shimming with regard to the slice plane set by the section for setting a slice plane, wherein the section for setting shim values calculates shim values in a system of coordinates perpendicular to the slice plane and, based on these shim values, calculates shim values in a system-inherent coordinate system for the whole of the magnetic resonance imaging apparatus.

A second aspect of the invention resides in a method for setting shim values in a magnetic resonance imaging apparatus, which carries out shimming, the method comprising a first step of setting at least one slice plane for obtaining desired tomographic image data; and a second step of calculating shim values in a system of coordinates perpendicular to the slice plane set in the first step and, based on these shim values, calculating shim values in a system-inherent coordinate system for the whole of the magnetic resonance imaging apparatus.

According to the invention, it is possible to provide a magnetic resonance imaging apparatus and a method for setting shim values, wherein optimal shim values can be obtained even if slice planes are slanted with respect to the system-inherent coordinate system.

Further objects and advantages of the present invention will be apparent from the following description of the preferred embodiments of the invention as illustrated in the accompanying drawings.

DETAILED DESCRIPTION OF THE INVENTION

In the following, an embodiment of the invention will be described.

MRI apparatus (magnetic resonance imaging apparatus) 1 of the invention has a feature in which it applies a unique manner of determining target regions from where shim values are acquired for shimming to correct inhomogeneity of static magnetic field applied to a subject.

Figure 1:
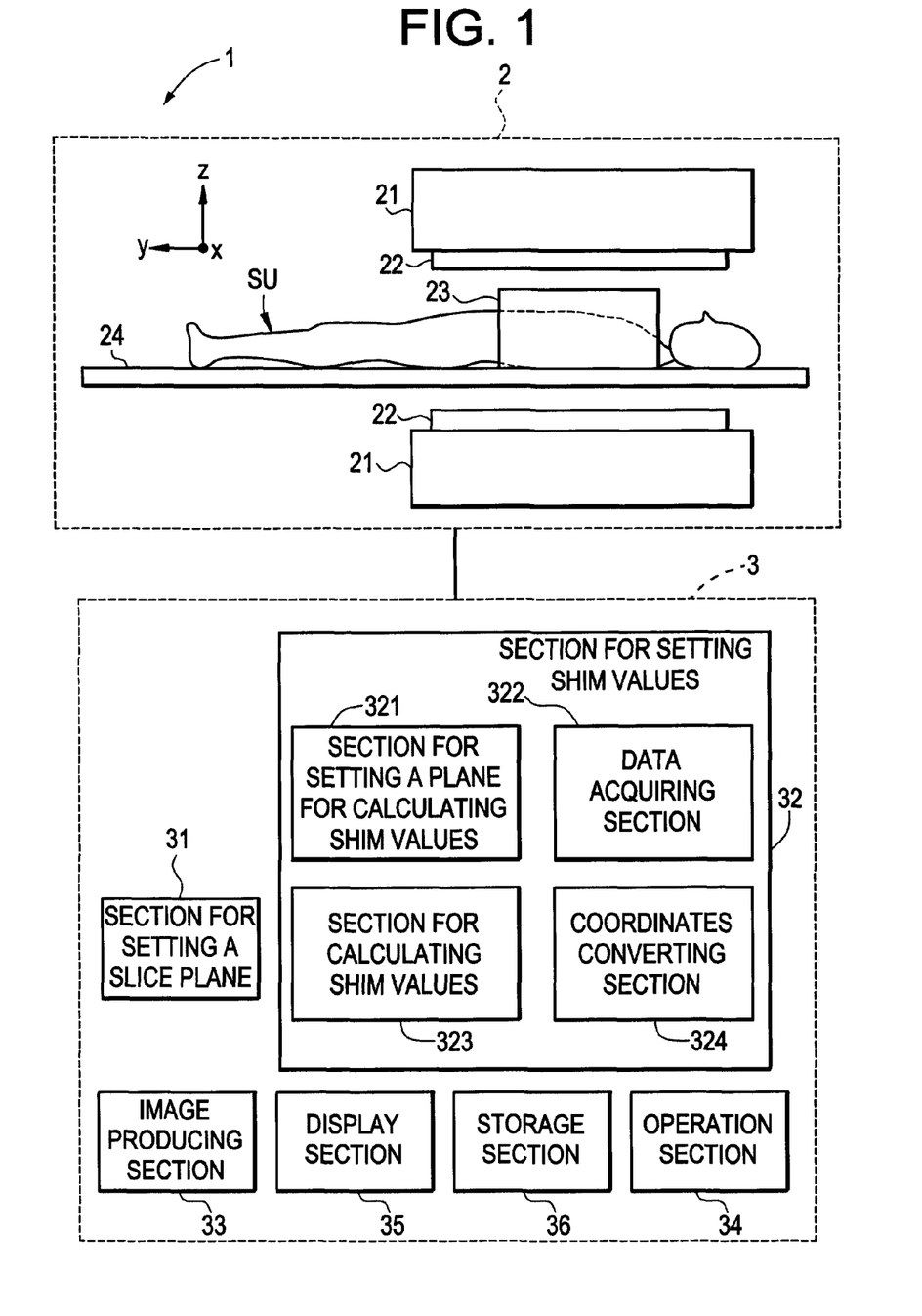
FIG. 1 is a structural diagram showing a structure of an MRI apparatus.

As is shown in FIG. 1, the MRI apparatus 1 comprises a scanning unit 2 and an operating console 3.

A system of x, y, and z coordinates, which is shown in FIG. 1, is the coordinate system for the whole of the MRI apparatus 1 (system-inherent coordinate system).

The scanning unit 2 is outlined.

The scanning unit 2, as shown in FIG. 1, comprises static magnetic field generating magnet assemblies 21, gradient coil assemblies 22, an RF coil assembly 23, and a table 24, and, within an imaging space in which a static magnetic field is formed, performs scanning which involves applying electromagnetic waves to a subject SU to excite an imaging region of the subject SU and acquiring magnetic resonance signals generated in the imaging region of the subject SU.

The components of the scanning unit 2 are described one by one.

The static magnetic field generating magnet assemblies 21 are configured using, for example, a pair of permanent magnet assemblies and form the static magnetic field within the imaging space where the subject SU lies. Herein, the static magnetic field generating magnet assemblies 21 form the static magnetic field so that the direction of the static magnetic field aligns with a direction z vertical to the axial direction of the body of the subject SU. The static magnetic field generating magnet assemblies 21 may be configured using superconductive magnet assemblies.

The gradient coil assemblies 22 form gradient magnetic fields in the imaging space where the static magnetic field is formed to add spatial position information to magnetic resonance signals which the RF coil assembly 23 receives. Herein, the gradient coil assemblies 22 consist of three systems of x, y, and z directions and form gradient magnetic fields in a frequency encoding direction, in a phase encoding direction, and in a slice selection direction, respectively, according to imaging conditions. In particular, the gradient coil assemblies 22 apply a gradient magnetic field in a slice selection direction of the subject SU and the RF coil assembly 23 sends RF pulses; thereby, a slice of the subject SU, which is excited, is selected. Also, the gradient coil assemblies 22 apply a gradient magnetic field in a phase encoding direction of the subject SU to phase encode the magnetic resonance signal from the slice excited by the RF pulses. Besides, the gradient coil assemblies 22 apply a gradient magnetic field in a frequency encoding direction of the subject SU to frequency encode the magnetic resonance signal from the slice excited by the RF pulses.

This MRI apparatus 1 adopts a method in which magnetic field inhomogeneity correction in the imaging region within the static magnetic field is performed by primary shimming and is arranged so that the primary shimming is performed by adjusting the gradient coils in the x, y, and z axis directions.

However, the invention is not so limited and may be configured such that shim coils exclusively used for shimming are provided in the static magnetic field generating magnet assemblies 21 and magnetic field inhomogeneity correction is performed by these shim coils.

The RF coil assembly 23 is placed to enclose the imaging region of the subject SU, as shown in FIG. 1. The RF coil assembly 23 sends RF pulses of electromagnetic waves to the subject SU and forms a radio-frequency magnetic field within the imaging space where the static magnetic field is formed by the static magnetic field generating magnet assemblies 21 and thus excites spins of protons in the imaging region of the subject SU. Then, the RF coil assembly 23 receives electromagnetic waves generated from the excited protons inside the subject SU as magnetic resonance signals (MR signals).

The table 24 serves as a platform on which the subject SU is rested. The table 24 moves in the imaging space and moves out therefrom, according to a control signal from the operating console 3.

Then, the operating console 3 is outlined.

The operating console 3, as shown in FIG. 1, comprises a section for setting a slice plane 31, a section for setting shim values 32, an image producing section 33, an operating section 34, a display section 35, and a storage section 36.

The components of the operating console 3 are described one by one.

The section for setting a slice plane 31 sets a slice plan including tomographic image data acquired with regard to the subject SU, based on instructions or the like given via the operating section 34 which will be described later. Here, the section for setting a slice plane 31 may set a plurality of slice planes.

The section for setting shim values 32 sets parameters (shim values) for shimming appropriate for the set slice plane. Here, the shimming is a processing of inhomogeneity correction in the imaging region where the static magnetic field has been disordered due to the entrance of the subject SU into the static magnetic field that was homogeneous.

The section for setting shim values 32 comprises a section for setting a plane for calculating shim values 321, which sets a plane on which data is acquired in a data acquiring section 322 for calculating shim values appropriate for the slice plane set by the section for setting a slice plane 31, a section for calculating shim values 323, which calculates shim values with regard to the plane set by the section for setting a plane for calculating shim values 321, and a coordinates converting section 324.

Figure 2:
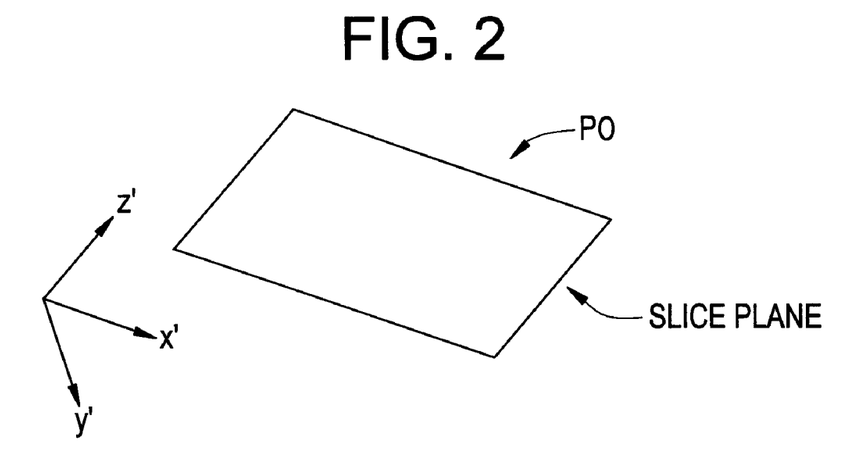
FIG. 2 is a diagram showing a relationship between a slice plane and an x'-y'-z' coordinate system set by a section for setting a plane for calculating shim values.

The section for setting a plane for calculating shim values 321 sets a system of coordinates x', y', and z' perpendicular to the slice plane, as is shown in FIG. 2.

This will be further explained below, taking an instance where the section for setting a plane for calculating shim values 321 sets a coordinate system such that the slice plane becomes parallel with the z'-x' plane of the x'-y'-z' coordinate system. This is only illustrative and the preset invention is not so limited; the only requirement of a coordinate system that is set by the section for setting a plane for calculating shim values 321 is that its coordinates are perpendicular to the slice plane. For example, a coordinate system such that the slice plane becomes parallel with its x'-y' plane may be set.

FIG. 2 is a diagram showing a relationship between a slice plane P0 and an x'-y'-z' coordinate system set by the section for setting a plane for calculating shim values 321.

Figure 3:
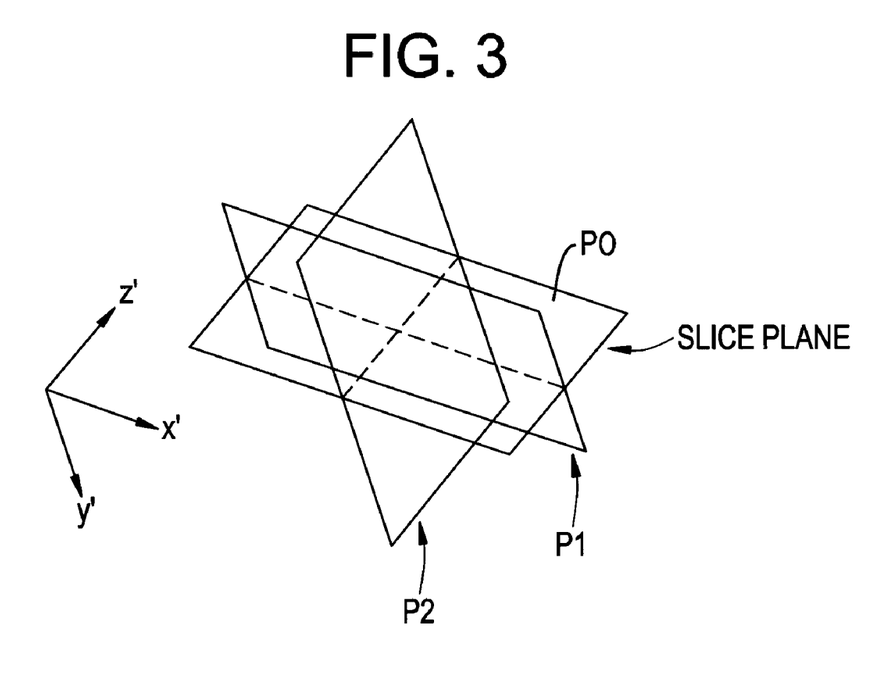
FIG. 3 is a diagram showing an example of how to set a first plane and a second plane.

Next, the section for setting a plane for calculating shim values 321 sets planes P1 and P2 perpendicular to the slice plane P0, as is shown in FIG. 3.

FIG. 3 is a diagram showing an example of how to set planes P1 and P2.

The plane P1 is, for example, a plane that is parallel with the x'-y' plane of the x'-y'-z' coordinate system and the plane P2 is a plane that is parallel with the y'-z' plane of the x'-y'-z' coordinate system.

Although a plurality of coordinate systems are possible as those in which the coordinates are perpendicular to one slice plane, any of them may be set by the section for setting a plane for calculating shim values 321. Although a plurality of planes are possible as those perpendicular to the slice plane, any of them may be set as P1 and P2 and, additionally, multiple P1 and P2 planes may be set. In the present embodiment, an instance where P1 and P2 are set as shown in FIG. 3 is discussed by way of illustration.

Figure 4:
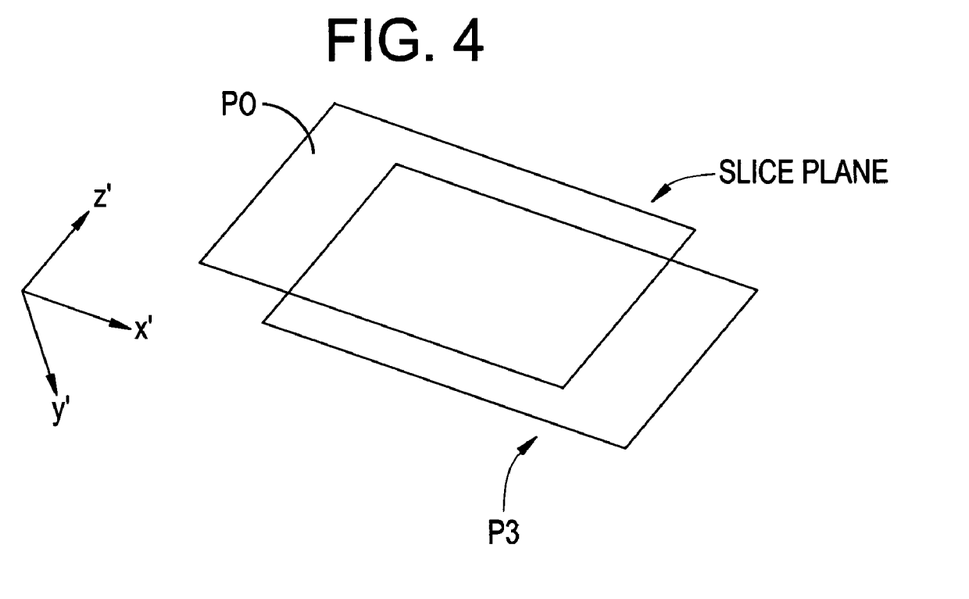
FIG. 4 is a diagram showing an example of how to set a third plane.

Next, the section for setting a plane for calculating shim values 321 sets a plane P3 that is parallel with the slice plane P0, as is shown in FIG. 4. Although a plurality of planes are possible as those parallel with the slice plane, any of them may be set as P3 and, additionally, a plurality of P3 planes may be set. In the present embodiment, an instance where P3 is set as shown in FIG. 4 is discussed by way of illustration.

FIG. 4 is a diagram showing an example of how to set a plane P3.

The data acquiring section 322 sends the scanning unit 2 a control signal for acquiring data for calculating shim values with regard to the planes set by the section for setting a plane for calculating shim values 321 and acquires the data. Shimming is performed with regard to the planes P1 to P3 set by the section for setting a plane for calculating shim values 321.

The section for calculating shim values 323 calculates shim values based on the data acquired from the planes P1 to P3 by the data acquiring section 322.

Here, the section for calculating shim values 323 performs a weighting operation to weight the shim values calculated based on the data acquired from the planes P1 to P3 by the data acquiring section 322 so that more precise shimming can be performed.

Referring to FIG. 5, the weighting operation that is performed by the section for calculating shim values 323 will be explained below in detail.

FIG. 5 is a set of diagrams to explain the weighting operation that is performed by the section for calculating shim values 323.

Figure 5A:
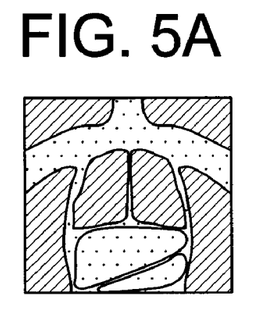
FIGS. 5(a), 5(b), 5(c), and 5(d) are a set of diagrams to explain a weighting operation that is performed by a section for calculating shim values.

FIG. 5(a) shows an original image produced based on the data acquired by based on the data acquiring section 322 with regard to the slice plane set by the section for setting a slice plane 31.

Figure 5B:
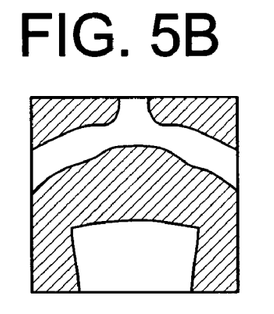

FIG. 5(b) shows a masked image resulting from filtering the original image shown in FIG. 5(a) using predetermined threshold values. The predetermined threshold values are not specified here. These values can be varied optionally according to an intended image and a probed portion of the subject.

Figure 5C:
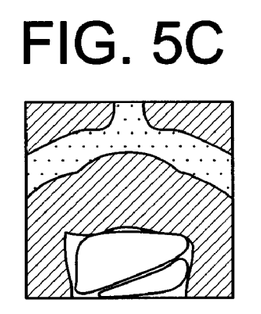

FIG. 5(c) shows a weighted image obtained by logically multiplying the original image shown in FIG. 5(a) with the masked image shown in FIG. 5(b).

Then, the section for calculating shim values 323 further produces another weighted image which is obtained by logically multiplying another original image obtained at a slight time shift from the time at which the original image shown in FIG. 5(a) was produced with another masked image resulting from filtering the original image obtained at the time shift.

Figure 5D:
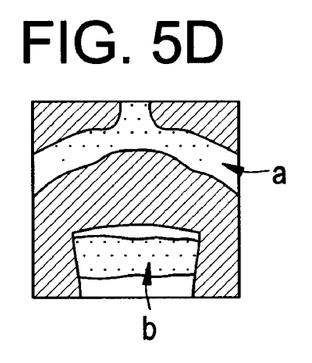

Finally, the section for calculating shim values 323 obtains a phase difference between the two weighted images obtained at different time instants and produces a phase image as shown in FIG. 5(d).

Here, as shown in FIG. 5, when a region where data for shimming can be taken (hereinafter termed a signal region; a white portion shown in FIG. 5(a)) is separated into a plurality of regions (regions a and b shown in FIG. 5(d) in FIG. 5), weighting in proportion to area ratio is performed for the respective signal regions.

In particular, if, in the phase image obtained in FIG. 5(d), the signal region a occupies an area of x % within the entire phase image shown in FIG. 5(d) and the region b occupies an area of y % within the entire phase image shown in FIG. 5(d), shim values are calculated as follow:

(shim values obtained in region a)×x/100+(shim values obtained in region b)×y/100.

The resulting values are taken as the shim values with regard to the image region shown in FIG. 5(a).

In this manner, the section for calculating shim values 323 automatically detects signal regions for calculating shim values and thereby can calculate optimal shim values.

Although a method of setting target regions for calculating shim values has been described here, the invention does not specify a method in which the section for calculating shim values 323 calculates shim values and, therefore, a description of how shim values are calculated from the set regions is omitted. The section for calculating shim values 323 calculates shim values from the set regions, using a known technique.

Figure 6:
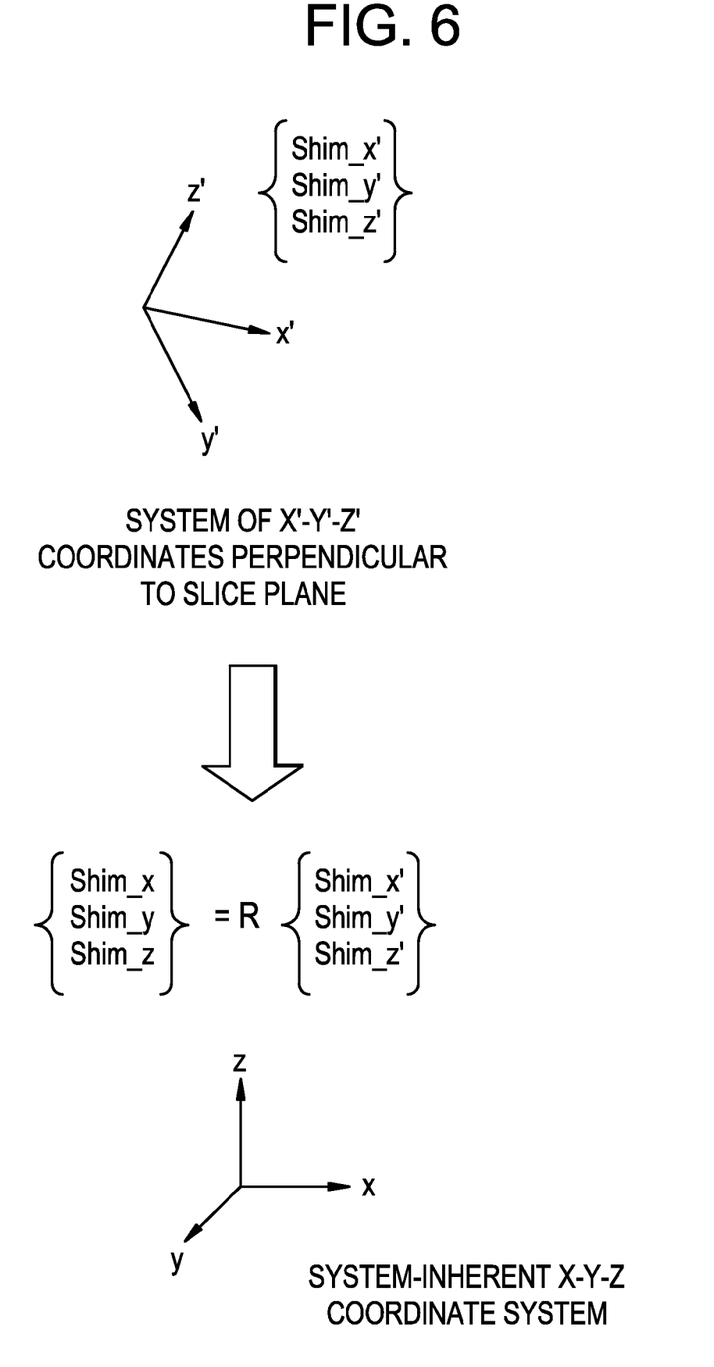
FIG. 6 is a conceptual diagram of coordinates conversion that is performed by a coordinates converting section.

FIG. 6 is a conceptual diagram of coordinates conversion that is performed by the coordinates converting section 324. Here, the shim values calculated by the section for calculating shim values 323 in the manner described above are the values in the system of coordinates perpendicular to the slice plane, as set by the section for setting a plane for calculating shim values 321, and represented as follows: (shim_x', shim_y', shim_z'). Hence, the shim values calculated by the section for calculating shim values 323 have to be converted to those values in the system-inherent coordinate system, because the MRI apparatus 1 must use the shim values in the system-inherent coordinate system of the MRI apparatus 1 when actually performing shimming.

For the above-noted reason, the coordinates converting section 324 converts the shim values (shim_x', shim_y', shim_z') in the x'-Y'-z' coordinate system, calculated by the section for calculating shim values 323, to shim values (shim_x, shim_y, shim_z) in the x-y-z coordinate system that is the system-inherent coordinate system of the MRI apparatus 1.

The conversion method may be a conversion method using tensor R for converting the x'-Y'-z' coordinate system to the x-y-z coordinate system. The invention does not specify this conversion method.

The section for setting shim values 32 performs shimming based on the shim values (shim_x, shim_y, shim_z) in the system-inherent coordinate system, output by the coordinates converting section 324. The invention does not specify a method in which shimming is performed.

The image producing section 33 sends the scanning unit 2 a control signal to execute a scan after shimming is performed by the section for setting shim values 32 with regard to the slice plane set by the section for setting a slice plane 31 and produces an MR image based on MR signals from the RF coil assembly 23.

The operating section 34 comprises operating devices such as a keyboard and a pointing device. The operating section 34 takes instruction data input by an operator and outputs the instruction data to each section.

The display section 35 comprises a display device such as CRT and displays an image on a screen. For example, the display section 35 displays on the screen an image including a plurality of entry items for which instruction data is input to the operating section 34 by the operator. Also, the display section 35 receives data corresponding to a slice image of the subject SU, which is generated based on magnetic resonance signals from the subject SU, and displays the slice image on the screen.

The storage section 36 comprises a memory and stores a variety of data. The data stored in the storage section 36 is accessed as required.

Then, how the MRI apparatus 1 of the present embodiment operates when calculating shim values is described.

Figure 7:
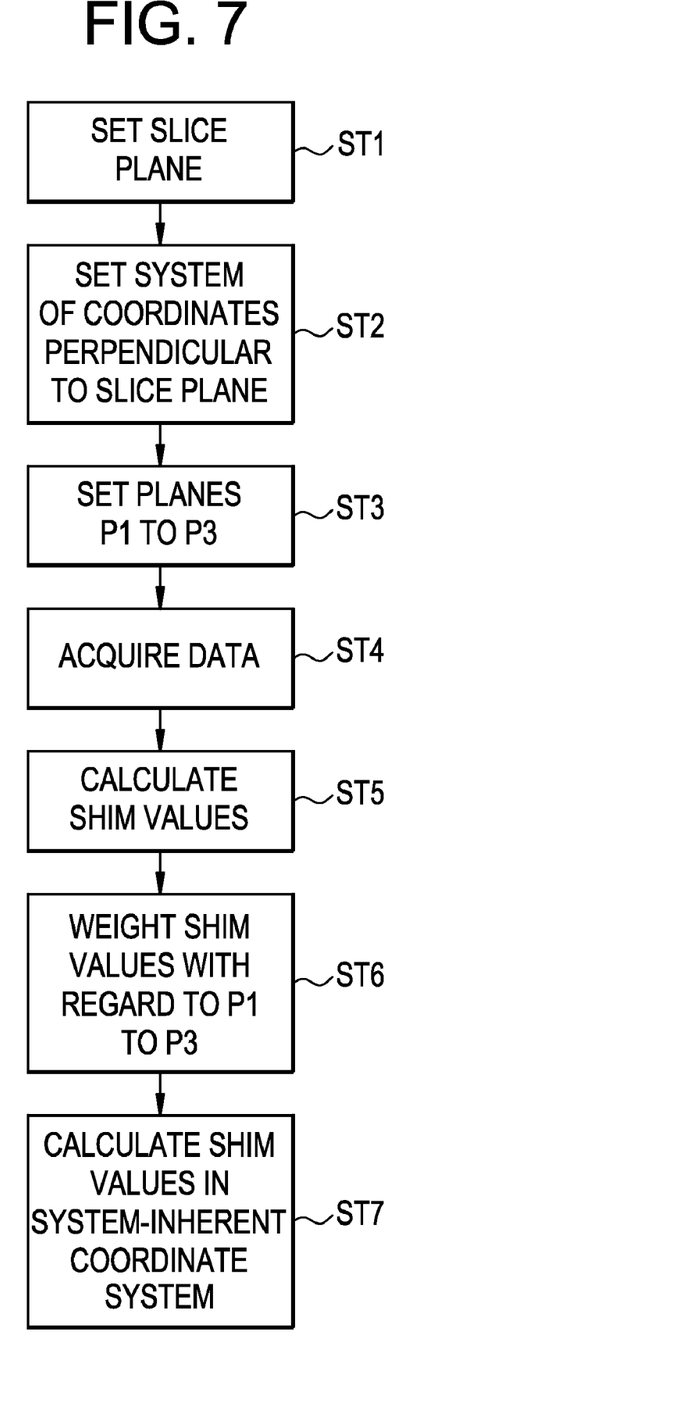
FIG. 7 is a flowchart to illustrate an example of the operation of the MRI apparatus shown in FIG. 1 when calculating shim values.

FIG. 7 is a flowchart to illustrate an example of the operation of the MRI apparatus 1 when calculating shim values.

Step ST1:
The section for setting a slice plane 31 sets a slice plane according instructions or the like specified via the operating section 34.

Step ST2:
The section for setting a plane for calculating shim values 321 sets a system of coordinates x', y', and z' perpendicular to the slice plane set by the section for setting a slice plane 31 in step ST1.

Step ST3:
The section for setting a plane for calculating shim values 321 sets planes P1 and P2 which are perpendicular to the slice plane and a plane P3 which is parallel with the slice plane in the x'-y'-z' coordinate system set in step ST2.

Step ST4:
The data acquiring section 322 acquires data with regard to the planes P1 to P3 set in step ST3.

Step ST5:
The section for calculating shim values 323 obtains shim values (shim_x', shim_y', shim_z') with regard to the slice plane in the x'-y'-z' coordinate system, based on the data acquired in step ST4.

Step ST6:
The section for calculating shim values 323 performs a weighting operation to weight the shim values calculated in step ST5, based on the area ratios of signal regions.

Step ST7:
The coordinates converting section 324 converts the shim values (shim_x', shim_y', shim_z') in the x'-Y'-z' coordinate system to shim values (shim_x, shim_y, shim_z) in the system-inherent x-y-z coordinate system of the MRI apparatus 1.

As described above, according to the MRI apparatus 1 of the present embodiment, because data is acquired and the section for calculating shim values 323 calculates shim values in a system of coordinates perpendicular to a slice plane that was set, independent of the system-inherent coordinate system, the shim values optimal for the slice plane can be calculated.

Since the section for calculating shim values 323 calculates shim values based on data acquired with regard to two planes perpendicular to the slice plane and one plane parallel with the slice plane in the system of coordinates perpendicular to the slice plane, more precise shim values can be calculated.

Since the section for calculating shim values 323 calculates shim values weighted in proportion to the area ratios of signal regions, more precise shim values can be calculated.

In the foregoing embodiment, data is acquired and shim values are calculated, based on planes P1, P2 perpendicular to and a plane P3 parallel with one slice plane set by the section for setting a plane for calculating shim values 321; however, the invention is not so limited. It may be possible to acquire data and calculate shim values based on only one of the planes P1 to P3 or to acquire data and calculate shim values from all of a plurality of planes perpendicular to and planes parallel with a plurality of slice planes.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus, which carries out shimming, comprising:
    a scanning unit; and
    an operating console, the operating console comprising:
        a section for setting a slice plane, which sets at least one slice plane for obtaining desired tomographic image data; and
        a section for setting shim values, which calculates and sets shim values for shimming with regard to the slice plane set by the section for setting a slice plane,
        wherein the section for setting shim values calculates shim values in a system of coordinates perpendicular to the slice plane and, based on these shim values, calculates shim values in a system-inherent coordinate system for the whole of the magnetic resonance imaging apparatus.

2. The magnetic resonance imaging apparatus according to claim 1, wherein:
    the section for setting shim values comprises:
    a section for setting a plane for acquiring shim values, which sets a system of coordinates perpendicular to the slice plane and sets at least one plane among planes perpendicular to the slice plane and a plane parallel with the slice plane in the system of coordinates, as the plane where data is acquired for calculating shim values;
    a data acquiring section which acquires data for calculating shim values from the plane set by the section for setting a plane for acquiring shim values;
    a section for calculating shim values, which calculate shim values in the system of coordinates set by the section for setting a plane for acquiring shim values, based on the data acquired by the data acquiring section; and
    a coordinates converting section which has a method for conversion from the coordinate system set by the section for setting a plane for acquiring shim values to the system-inherent coordinate system and converts the shim values calculated by the section for calculating shim values in the coordinate system set by the section for setting a plane for acquiring shim values to shim values in the system-inherent coordinate system.

3. The magnetic resonance imaging apparatus according to claim 2, wherein:
    the coordinates converting section converts the shim values calculated by the section for calculating shim values by using rotation tensor for conversion from the coordinate system set by the section for setting a plane for acquiring shim values to the system-inherent coordinate system.

4. The magnetic resonance imaging apparatus according to claim 2, wherein:
    the section for setting a plane for acquiring shim values sets two planes which are perpendicular to the slice plane and one plane which is parallel with the slice plane in the system of coordinates perpendicular to the slice plane, as the planes where data is acquired for calculating shim values.

5. The magnetic resonance imaging apparatus according to claim 2, wherein:
    the section for setting a plane for acquiring shim values sets all of a plurality of planes which are perpendicular to the slice plane and a plurality of planes which are parallel with the slice plane in the system of coordinates perpendicular to the slice plane, as the planes where data is acquired for calculating shim values.

6. The magnetic resonance imaging apparatus according to claim 2, wherein:
    the section for calculating shim values weights the shim values in proportion to area ratios of signal regions from where data was acquired by the data acquiring section within each plane set by the section for setting a plane for acquiring shim values.

7. The magnetic resonance imaging apparatus according to claim 6, wherein:
    the section for calculating shim values filters an original image.

8. The magnetic resonance imaging apparatus according to claim 7, wherein:
    the section for calculating shim values multiplies logically the original image with a masked image that the original image is filtered.

9. The magnetic resonance imaging apparatus according to claim 8, wherein:
    the section for calculating shim values multiplies logically a second original image that is obtained at a slight time shift with another masked image that the second original image is filtered.

10. The magnetic resonance imaging apparatus according to claim 9, wherein:
    the section for calculating shim values obtains a phase difference between two weighted images that are obtained by logically multiplying.

11. A method for setting shim values in a magnetic resonance imaging apparatus, which carries out shimming, the method comprising:
    a first step of setting at least one slice plane for obtaining desired tomographic image data; and
    a second step of calculating shim values in a system of coordinates perpendicular to the slice plane set in the first step and, based on these shim values, calculating shim values in a system-inherent coordinate system for the whole of the magnetic resonance imaging apparatus.

12. The method for setting shim values according to claim 11, wherein:
the second step comprises:
a third step of setting a system of coordinates perpendicular to the slice plane set in the first step and setting at least one plane among planes perpendicular to the slice plane and a plane parallel with the slice plane in the system of coordinates, as the plane where data is acquired for calculating shim values;
a fourth step of acquiring data for calculating shim values from the plane set in the third step;
a fifth step of calculating shim values in the system of coordinates set by the section for setting a plane for acquiring shim values, based on the data acquired in the fourth step; and
a sixth step of converting the shim values in the coordinate system, set in the fifth step, to shim values in the system-inherent coordinate system.

13. The method for setting shim values according to claim 12, wherein:
the sixth step converts the shim values calculated in the fifth step by using rotation tensor for conversion from the coordinate system set in the third step for setting a plane for acquiring shim values to the system-inherent coordinate system.

14. The method for setting shim values according to claim 12, wherein:
the third step sets two planes which are perpendicular to the slice plane and one plane which is parallel with the slice plane in the system of coordinates perpendicular to the slice plane, as the planes where data is acquired for calculating shim values.

15. The method for setting shim values according to claim 12, wherein:
the third step sets all of a plurality of planes which are perpendicular to the slice plane and a plurality of planes which are parallel with the slice plane in the system of coordinates perpendicular to the slice plane, as the planes where data is acquired for calculating shim values.

16. The method for setting shim values according to claim 12, wherein:
the fifth step weights the shim values in proportion to area ratios of signal regions from where data was acquired by the data acquiring section within each plane set in the third step.

17. The method for setting shim values according to claim 16, wherein:
the fifth step filters an original image.

18. The method for setting shim values according to claim 17, wherein:
the fifth step multiplies logically the original image with a masked image that the original image is filtered.

19. The method for setting shim values according to claim 18, wherein:
the fifth step multiplies logically a second original image that is obtained at a slight time shift with another masked image that the second original image is filtered.

20. The method for setting shim values according to claim 19, wherein:
the fifth step obtains a phase difference between two weighted images that are obtained by logically multiplying.

* * * * *